(12) United States Patent
Wang et al.

(10) Patent No.: US 12,706,126 B2
(45) Date of Patent: Aug. 11, 2026

(54) MEMORY SUB-SYSTEM INCOMPLETE SHUTDOWN DEBUGGING

(71) Applicant: Micron Technology, Inc., Boise, ID (US)

(72) Inventors: Xiaoyang Wang, Shanghai (CN); Yunfei You, Shanghai (CN); He Sang, Shanghai (CN)

(73) Assignee: Micron Technology, Inc., Boise, ID (US)

( * ) Notice: Subject to any disclaimer, the term of this patent is extended or adjusted under 35 U.S.C. 154(b) by 27 days.

(21) Appl. No.: 18/788,681

(22) Filed: Jul. 30, 2024

(65) Prior Publication Data

US 2026/0038546 A1 Feb. 5, 2026

(51) Int. Cl.
*G11C 5/14* (2006.01)
*G11C 29/50* (2006.01)

(52) U.S. Cl.
CPC .............. *G11C 5/148* (2013.01); *G11C 29/50* (2013.01); *G11C 2029/5006* (2013.01)

(58) Field of Classification Search
CPC .. G11C 29/50; G11C 2029/5006; G11C 5/148
See application file for complete search history.

(56) References Cited

U.S. PATENT DOCUMENTS 7,003,621 B2 * 2/2006 Koren .................... G11C 16/16 365/230.03
10,430,092 B1 * 10/2019 Wu .................... G11C 14/0063
2021/0255920 A1 * 8/2021 Bernat ....................... G06F 1/30
2023/0142479 A1 * 5/2023 Lee ....................... G06F 3/0619 711/103

* cited by examiner

*Primary Examiner* — Guerrier Merant
*Assistant Examiner* — Victor Perry
(74) *Attorney, Agent, or Firm* — Schwegman Lundberg & Woessner, P.A.

(57) ABSTRACT

The disclosure configures a memory sub-system controller to enable debugging incomplete shutdown of a memory sub-system. The controller detects a power-loss event associated with incomplete shutdown of the memory sub-system. The controller, in response to detecting the power-loss event associated with the memory sub-system, retrieves a subset of debugging fields. The controller stores the subset of debugging fields in a reprogrammable read-only memory associated with the memory sub-system.

20 Claims, 6 Drawing Sheets

400

| Field Name (410) | Size (420) | Value (430) | When Set (440) | When Flush (450) | When Clear (460) |
|---|---|---|---|---|---|
| aplFlag (412) | 2 | 0xa55a | At HS0 apl handler entrance if no error detected. | Flushed in HS0 apl entry or panic entry; | Cleared after read from EEPROM in bootup if no error detected. OR Sanitize command |
| panicStatusCode (414) | 2 | statusCode | At panic entrance | Flushed in panic entrance | Sanitize command |
| panicStep (416) | 1 | 1~10 | In panic flow | Flushed several times in panic flow | Sanitize command |
| DoublePanic (417) | 1 | 0xA8 | In double panic mode handler entrance | In double panic mode handler | Sanitize command |
| pmicErrFlag (418) | 1 | 0x4b for pmic status error;<br>0xb4 for pmic i2c error | At panic entrance | Flushed in panic entrance | Sanitize command |

*FIG. 4*

MEMORY SUB-SYSTEM INCOMPLETE SHUTDOWN DEBUGGING

TECHNICAL FIELD

Examples of the disclosure relate generally to memory sub-systems and, more specifically, to debugging incomplete shutdown of the memory sub-systems.

BACKGROUND

A memory sub-system can be a storage system, such as a solid-state drive (SSD), and can include one or more memory components that store data. The memory components can be, for example, non-volatile memory components and volatile memory components. In general, a host system can utilize a memory sub-system to store data on the memory components and to retrieve data from the memory components.

BRIEF DESCRIPTION OF THE DRAWINGS

The present disclosure will be understood more fully from the detailed description given below and from the accompanying drawings of various examples of the disclosure.

FIG. 4 is a block diagram of example debugging field generation operations performed based on a power-loss event, in accordance with some examples.

DETAILED DESCRIPTION

Figure 1:
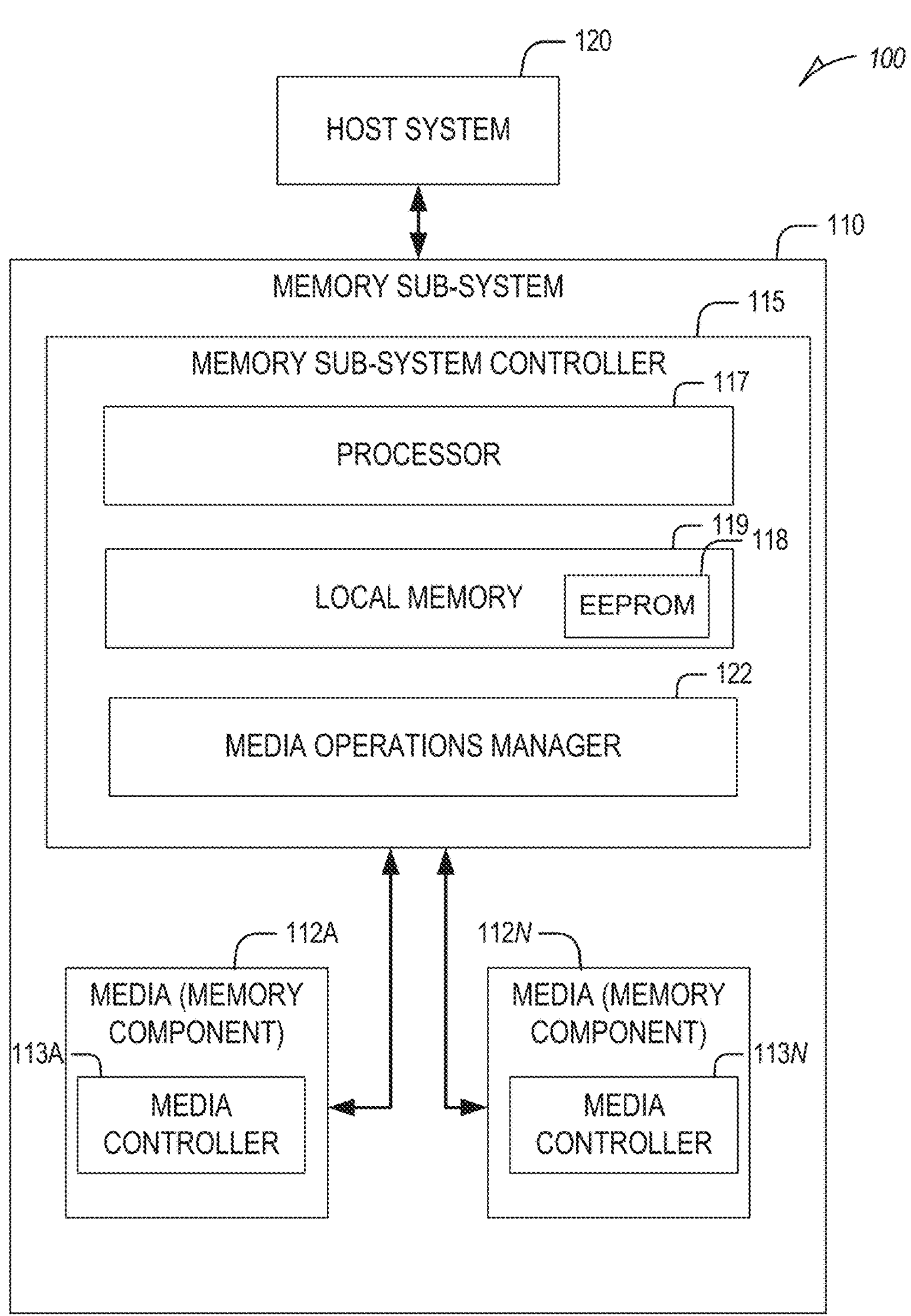
FIG. 1 is a block diagram illustrating an example computing environment including a memory sub-system, in accordance with some examples.

Examples of the present disclosure configure a system component, such as a memory sub-system controller, to enable debugging incomplete shutdown of a memory sub-system after encountering a power loss event. Specifically, the disclosed techniques can utilize a capacitor to temporarily delivery enough power to the memory sub-system when one or more power sources stop delivering power. Using the power discharged by the capacitor, the memory controller can retrieve one or more debugging fields and store the debugging fields in a programmable read-only memory. An operator can then retrieve the information stored in the programmable read-only memory to debug the reasons for the incomplete shutdown which can improve future operations of the memory sub-system.

A memory sub-system can be a storage device, a memory module, or a hybrid of a storage device and memory module. Examples of storage devices and memory modules are described below in conjunction with FIG. 1. In general, a host system can utilize a memory sub-system that includes one or more memory components, such as memory devices (e.g., memory dies or planes across multiple memory dies) that store data. The host system can send access requests (e.g., write command, read command) to the memory sub-system, such as to store data at the memory sub-system and to read data from the memory sub-system. The data (or set of data) specified by the host is hereinafter referred to as "host data," "application data," or "user data."

The memory sub-system can initiate media management operations (also referred to as backend operations), such as a write operation, on host data that is stored on a memory device. For example, firmware of the memory sub-system may re-write previously written host data from a location on a memory device to a new location as part of garbage collection management operations. The data that is re-written, for example as initiated by the firmware, is hereinafter referred to as "garbage collection data." "User data" can include host data and garbage collection data. "System data" hereinafter refers to data that is created and/or maintained by the memory sub-system for performing operations in response to host requests and for media management. Examples of system data include, and are not limited to, system tables (e.g., logical-to-physical address mapping table), data from logging, scratch pad data, etc.

Many different media management operations can be performed on the memory device. For example, the media management operations can include different scan rates, different scan frequencies, different wear leveling, different read disturb management, different near miss error correction (ECC), and/or different dynamic data refresh. Wear leveling ensures that all blocks in a memory component approach their defined erase-cycle budget at the same time, rather than some blocks approaching it earlier. Read disturb management counts all of the read operations to the memory component. If a certain threshold is reached, the surrounding regions are refreshed. Near-miss ECC refreshes all data read by the application that exceeds a configured threshold of errors. Dynamic data-refresh scan reads all data and identifies the error status of all blocks as a background operation. If a certain threshold of errors per block or ECC unit is exceeded in this scan-read, a refresh operation is triggered.

A memory device can be a non-volatile memory device. A non-volatile memory device is a package of one or more dice (or dies). Each die can be comprised of one or more planes. For some types of non-volatile memory devices (e.g., negative- and (NAND) devices), each plane is comprised of a set of physical blocks. For some memory devices, blocks are the smallest area that can be erased. Such blocks can be referred to or addressed as logical units (LUN). Each block is comprised of a set of pages. Each page is comprised of a set of memory cells, which store bits of data. The memory devices can be raw memory devices (e.g., NAND), which are managed externally, for example, by an external controller. The memory devices can be managed memory devices (e.g., managed NAND), which is a raw memory device combined with a local embedded controller for memory management within the same memory device package.

In some cases, memory sub-systems encounter incomplete shutdown during expected or unexpected power-loss events. During normal and complete shutdown of the memory sub-system, several shutdown operations are performed to preserve data integrity and prevent data loss. When the memory sub-systems encounter incomplete shutdown, power to the memory sub-system is lost before the shutdown operations can be initiated and/or completed. The incomplete shutdown can result in data corruption and data loss and can be challenging to debug.

Determining the reasons for an incomplete shutdown of NAND flash memory presents a complex challenge, primarily due to the intricate nature of NAND operations and the multitude of factors that can influence its behavior. NAND flash memory, widely used in solid-state drives (SSDs), USB drives, and other storage devices, is sensitive to disruptions during its operation, particularly during the write and erase cycles. An incomplete shutdown typically occurs when the power supply to the NAND is unexpectedly cut off or disrupted, which can lead to a range of issues from data corruption to physical damage of the memory cells. One of the challenges in diagnosing the cause of an incomplete shutdown in NAND devices is the difficulty in replicating and observing the exact conditions under which the issue occurred. NAND operations are highly dependent on the precise timing and sequence of electrical signals, and any deviation due to power anomalies can be fleeting and hard to capture with standard diagnostic tools. Moreover, the internal state of the NAND, including the status of ongoing operations, is not always externally visible, making it challenging to determine whether the device was in the middle of a critical write or erase operation when the shutdown occurred.

Additionally, the architecture and firmware of NAND devices are designed to manage a complex array of tasks simultaneously, including wear leveling, error correction, and bad block management. Each of these processes has its own set of parameters and thresholds, which can be affected differently by an incomplete shutdown. For instance, abrupt power loss during wear leveling, which involves the redistribution of data across the memory cells to extend the lifespan of the device, can result in uneven wear or untracked bad blocks, complicating the diagnosis. The interdependencies between these processes mean that a failure in one area can cascade, leading to broader system impacts that obscure the original cause of the shutdown. Furthermore, environmental factors such as temperature fluctuations, electrostatic discharges, or voltage spikes in the operating environment can also trigger incomplete shutdowns. These factors are often intermittent and can vary significantly between different usage scenarios, adding another layer of complexity to the troubleshooting process. The challenges in determining the reasons for incomplete shutdowns of NAND flash memory are multifaceted, involving both the internal dynamics of NAND operation and external environmental conditions. Conventional systems provide no effective mechanism by which to diagnose and debug these reasons.

Examples of the present disclosure address the above and other deficiencies by providing a memory sub-system controller that enables debugging incomplete shutdown of a memory sub-system after encountering a power loss event. Specifically, the disclosed techniques can utilize a capacitor to temporarily delivery enough power to the memory sub-system when one or more power sources stop delivering power. Using the power discharged by the capacitor, the disclosed techniques can retrieve one or more debugging fields and store the debugging fields in a programmable read-only memory. An operator can then retrieve the information stored in the programmable read-only memory to debug the reasons for the incomplete shutdown which can improve future operations of the memory sub-system.

In some examples, the memory controller detects a power-loss event associated with incomplete shutdown of the memory sub-system and, in response to detecting the power-loss event associated with the memory sub-system, retrieves a subset of debugging fields. The controller stores the subset of debugging fields in a reprogrammable read-only memory associated with the memory sub-system. In some cases, a capacitor can be coupled to at least one processing device and configured to deliver power to the memory sub-system during a power-loss event. The capacitor can be coupled to a power source of the at least one processing device and a host system.

The at least one processing device can be configured to receive power being discharged from the capacitor when power stops being received from the power source. The power-loss event can occur when the at least one processing device stops receiving power from the power source. In some examples, the at least one processing device can be configured to retrieve the subset of debugging fields and store the subset of debugging fields before the capacitor completely discharges. In some cases, the reprogrammable read-only memory includes an electrically erasable programmable read-only memory (EEPROM). The EEPROM can include a first portion for storing vendor product data (VPD) and a second portion reserved for storing the subset of debugging fields. The VPD can include at least one of a serial number, a manufacturer identifier, firmware version, capacity, interface type, flash type, write and read speeds, operating temperature range, power consumption, error correction code type, geometry information including number of planes and blocks, or a model number of the memory sub-system.

In some examples, the subset of debugging fields includes a power-loss flag field. The power-loss flag field can be set in response to initiating power-loss functions associated with the power-loss event. The controller can store the power-loss flag field in the reprogrammable read-only memory in response to initiating the power-loss functions or in response to detecting initiation of a panic mode. The power-loss flag field can be cleared in response to being read from the reprogrammable read-only memory when no error is detected or in response to a sanitize command.

The subset of debugging fields can include a panic mode status field. The panic mode status field can be set and stored in the reprogrammable read-only memory in response to initiating panic mode. The panic mode status field can be cleared in response to a sanitize command. The subset of debugging fields can include a panic step field. The panic step field can be set during the panic mode and represent individual operations of the panic mode. The controller can store the panic step field periodically during the panic mode in the reprogrammable read-only memory.

In some examples, the subset of debugging fields includes a double panic mode status field. The double panic mode status field can be set and stored in the reprogrammable read-only memory in response to initiating panic mode a second time. In some cases, the subset of debugging fields includes a power supply error indicator field. The power supply error indicator field can be set and stored in the reprogrammable read-only memory in response to initiating panic mode. The power supply error indicator field can indicate whether an error has been encountered in association with a power supply of the memory sub-system. The controller can read the subset of debugging fields from the reprogrammable read-only memory associated with the memory sub-system to debug a reason for the incomplete shutdown of the memory sub-system.

Though various examples are described herein as being implemented with respect to a memory sub-system (e.g., a controller of the memory sub-system), some or all of the portions of an example can be implemented with respect to a host system, such as a software application or an operating system of the host system.

FIG. 1 illustrates an example computing environment 100 including a memory sub-system 110, in accordance with some examples. The memory sub-system 110 can include media, such as memory components 112A to 112N (also hereinafter referred to as "memory devices"). The memory components 112A to 112N can be volatile memory devices, non-volatile memory devices, or a combination of such. The memory components 112A to 112N can be implemented by individual dies, such that a first memory component 112A can be implemented by a first memory die (or a first collection of memory dies) and a second memory component 112N can be implemented by a second memory die (or a second collection of memory dies). Each memory die can include a plurality of planes in which data can be stored or programmed. In some cases, the first memory component 112A can be implemented by a first SSD (or a first independently operable memory sub-system) and the second memory component 112N can be implemented by a second SSD (or a second independently operable memory sub-system).

In some examples, the memory sub-system 110 is a storage system. A memory sub-system 110 can be a storage device, a memory module, or a hybrid of a storage device and memory module. Examples of a storage device include a solid-state drive (SSD), a flash drive, a universal serial bus (USB) flash drive, an embedded Multi-Media Controller (eMMC) drive, a Universal Flash Storage (UFS) drive, and a hard disk drive (HDD). Examples of memory modules include a dual in-line memory module (DIMM), a small outline DIMM (SO-DIMM), and a non-volatile dual in-line memory module (NVDIMM).

The computing environment 100 can include a host system 120 that is coupled to a memory system. The memory system can include one or more memory sub-systems 110. In some examples, the host system 120 is coupled to different types of memory sub-system 110. FIG. 1 illustrates one example of a host system 120 coupled to one memory sub-system 110. The host system 120 uses the memory sub-system 110, for example, to write data to the memory sub-system 110 and read data from the memory sub-system 110. As used herein, "coupled to" generally refers to a connection between components, which can be an indirect communicative connection or direct communicative connection (e.g., without intervening components), whether wired or wireless, including connections such as electrical, optical, magnetic, etc.

The host system 120 can be a computing device such as a desktop computer, laptop computer, network server, mobile device, embedded computer (e.g., one included in a vehicle, industrial equipment, or a networked commercial device), or such computing device that includes a memory and a processing device. The host system 120 can include or be coupled to the memory sub-system 110 so that the host system 120 can read data from or write data to the memory sub-system 110. The host system 120 can be coupled to the memory sub-system 110 via a physical host interface. Examples of a physical host interface include, but are not limited to, a serial advanced technology attachment (SATA) interface, a peripheral component interconnect express (PCIe) interface, a compute express link (CXL), a universal serial bus (USB) interface, a Fibre Channel interface, a Serial Attached SCSI (SAS) interface, etc. The physical host interface can be used to transmit data between the host system 120 and the memory sub-system 110. The host system 120 can further utilize an NVM Express (NVMe) interface to access the memory components 112A to 112N when the memory sub-system 110 is coupled with the host system 120 by the PCIe or CXL interface. The physical host interface can provide an interface for passing control, address, data, and other signals between the memory sub-system 110 and the host system 120.

The memory components 112A to 112N (which are used to implement the storage capabilities of the memory sub-system 110) can include any combination of the different types of non-volatile memory components and/or volatile memory components and/or storage devices. An example of non-volatile memory components includes a NAND-type flash memory. Each of the memory components 112A to 112N can include one or more arrays of memory cells such as single-level cells (SLCs) or multi-level cells (MLCs) (e.g., tri-level cells (TLCs) or quad-level cells (QLCs)). In some examples, a particular memory component 112 can include both an SLC portion and an MLC portion of memory cells. Each of the memory cells can store one or more bits of data (e.g., blocks) used by the host system 120. Although non-volatile memory components such as NAND-type flash memory are described, the memory components 112A to 112N can be based on any other type of memory, such as a volatile memory. In some examples, the memory components 112A to 112N can be, but are not limited to, random access memory (RAM), read-only memory (ROM), dynamic random access memory (DRAM), synchronous dynamic random access memory (SDRAM), phase change memory (PCM), magnetoresistive random access memory (MRAM), negative-or (NOR) flash memory, electrically erasable programmable read-only memory (EEPROM), and a cross-point array of non-volatile memory cells.

A cross-point array of non-volatile memory cells can perform bit storage based on a change of bulk resistance, in conjunction with a stackable cross-gridded data access array. Additionally, in contrast to many flash-based memories, cross-point non-volatile memory can perform a write-in-place operation, where a non-volatile memory cell can be programmed without the non-volatile memory cell being previously erased. Furthermore, the memory cells of the memory components 112A to 112N can be grouped as memory pages or blocks that can refer to a unit of the memory component 112 used to store data. For example, a single first row that spans a first set of the pages or blocks of the memory components 112A to 112N can correspond to or be grouped as a first block stripe and a single second row that spans a second set of the pages or blocks of the memory components 112A to 112N can correspond to or be grouped as a second block stripe.

The memory sub-system controller 115 can communicate with the memory components 112A to 112N to perform memory operations such as reading data, writing data, or erasing data at the memory components 112A to 112N and other such operations. The memory sub-system controller 115 can communicate with the memory components 112A to 112N to perform various memory management operations (also referred to as back-end operations), such as different scan rates, different scan frequencies, different wear leveling, different read disturb management, garbage collection operations, different near miss ECC operations, and/or different dynamic data refresh.

The memory sub-system controller 115 can include hardware, such as one or more integrated circuits and/or discrete components, a buffer memory, or a combination thereof. The memory sub-system controller 115 can be a microcontroller, special-purpose logic circuitry (e.g., a field programmable gate array (FPGA), an application-specific integrated circuit (ASIC), etc.), or another suitable processor. The memory sub-system controller 115 can include a processor (processing device) 117 configured to execute instructions stored in local memory 119. In the illustrated example, the local memory 119 of the memory sub-system controller 115 includes an embedded memory configured to store instructions for performing various processes, operations, logic flows, and routines that control operation of the memory sub-system 110, including handling communications between the memory sub-system 110 and the host system 120. In some examples, the local memory 119 can include memory registers storing memory pointers, fetched data, and so forth. The local memory 119 can also include ROM for storing microcode.

Figure 3:
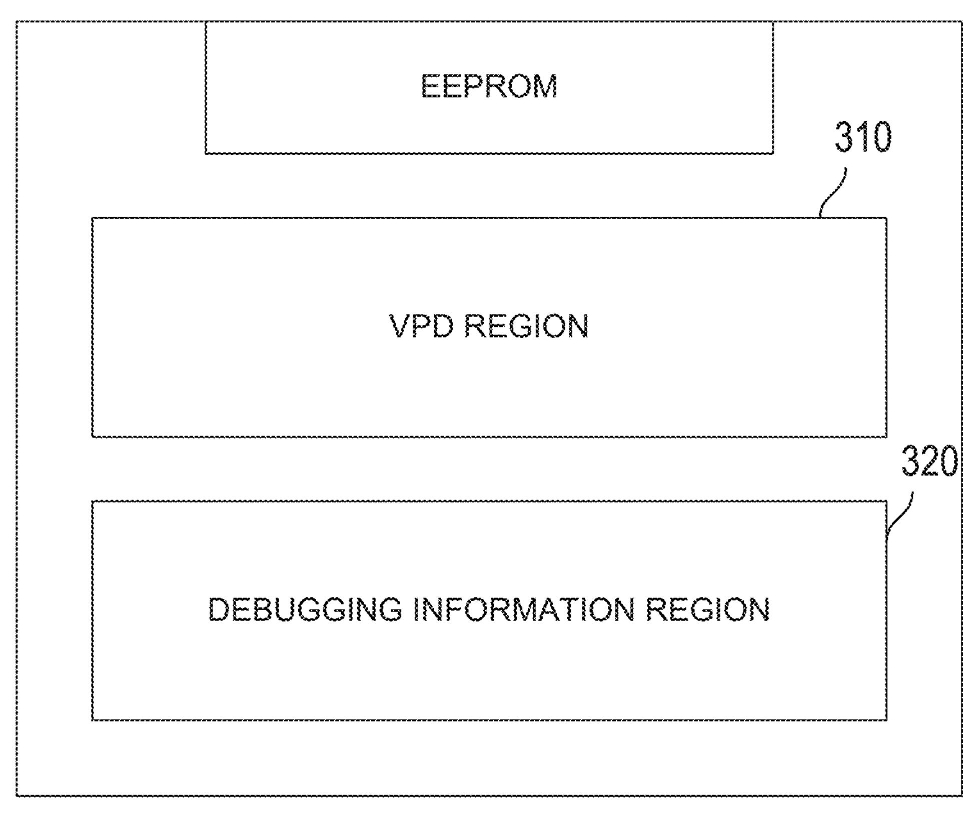
FIG. 3 is a block diagram of an electrically erasable programmable read-only memory (EEPROM) coupled to the memory sub-system, in accordance with some examples.

The local memory 119 can include an EEPROM (or any other suitable programmable read-only memory device), such as the EEPROM 300 shown in FIG. 3. The EEPROM 300 can include a first portion 310 for storing vendor product data (VPD) and a second portion 320 reserved for storing a subset of debugging fields. The VPD can include at least one of a serial number, a manufacturer identifier, firmware version, capacity, interface type, flash type, write and read speeds, operating temperature range, power consumption, error correction code type, geometry information including number of planes and blocks, or a model number of the memory sub-system 110. The second portion 320 can store various debugging fields (discussed below) including any one of a power loss flag field, a panic mode status field, a panic step field, a double panic mode status field, and/or a power supply error indicator field.

While the example memory sub-system 110 in FIG. 1 has been illustrated as including the memory sub-system controller 115, in another example of the present disclosure, a memory sub-system 110 may not include a memory sub-system controller 115, and can instead rely upon external control (e.g., provided by an external host, or by a processor 117 or controller separate from the memory sub-system 110).

In general, the memory sub-system controller 115 can receive commands or operations from the host system 120 and can convert the commands or operations into instructions or appropriate commands to achieve the desired access to the memory components 112A to 112N. In some examples, the commands or operations received from the host system 120 can specify configuration data for the memory components 112A to 112N. The configuration data can describe the lifetime (maximum) program-erase count (PEC) values and/or reliability grades associated with different groups of the memory components 112A to 112N and/or different blocks within each of the memory components 112A to 112N of each memory component used to implement the memory sub-system.

The memory sub-system controller 115 can be responsible for other memory management operations, such as wear leveling operations, garbage collection operations, error detection and ECC operations, encryption operations, caching operations, and address translations. The memory sub-system controller 115 can further include host interface circuitry to communicate with the host system 120 via the physical host interface. The host interface circuitry can convert the commands received from the host system 120 into command instructions to access the memory components 112A to 112N as well as convert responses associated with the memory components 112A to 112N into information for the host system 120.

The memory sub-system 110 can also include additional circuitry or components that are not illustrated. In some examples, the memory sub-system 110 can include a cache or buffer (e.g., DRAM or other temporary storage location or device) and address circuitry (e.g., a row decoder and a column decoder) that can receive an address from the memory sub-system controller 115 and decode the address to access the memory components 112A to 112N. The memory sub-system 110 can include a capacitor for delivering temporary power to the memory sub-system 110 during a power loss event.

The memory devices can be raw memory devices (e.g., NAND), which are managed externally, for example, by an external controller (e.g., memory sub-system controller 115). The memory devices can be managed memory devices (e.g., managed NAND), which is a raw memory device combined with a local embedded controller (e.g., local media controllers) for memory management within the same memory device package. Any one of the memory components 112A to 112N can include a media controller (e.g., media controller 113A and media controller 113N) to manage the memory cells of the memory component (e.g., to perform one or more memory management operations), to communicate with the memory sub-system controller 115, and to execute memory requests (e.g., read or write) received from the memory sub-system controller 115.

In some examples, a media operations manager 122 enables debugging of an incomplete shutdown of a memory sub-system 110 after encountering a power-loss event. Specifically, the media operations manager 122 can utilize a capacitor to temporarily deliver enough power to the memory sub-system 110 when one or more power sources stop delivering power. Using the power discharged by the capacitor, the media operations manager 122 can retrieve one or more debugging fields and store the debugging fields in a programmable read-only memory, such as the EEPROM 118 or EEPROM 300. An operator, using the host system 120, can then retrieve the information stored in the programmable read-only memory to debug the reasons for the incomplete shutdown which can improve future operations of the memory sub-system 110.

Depending on the example, the media operations manager 122 can comprise logic (e.g., a set of transitory or non-transitory machine instructions, such as firmware) or one or more components that causes the media operations manager 122 to perform operations described herein. The media operations manager 122 can comprise a tangible or non-tangible unit capable of performing operations described herein.

Figure 2:
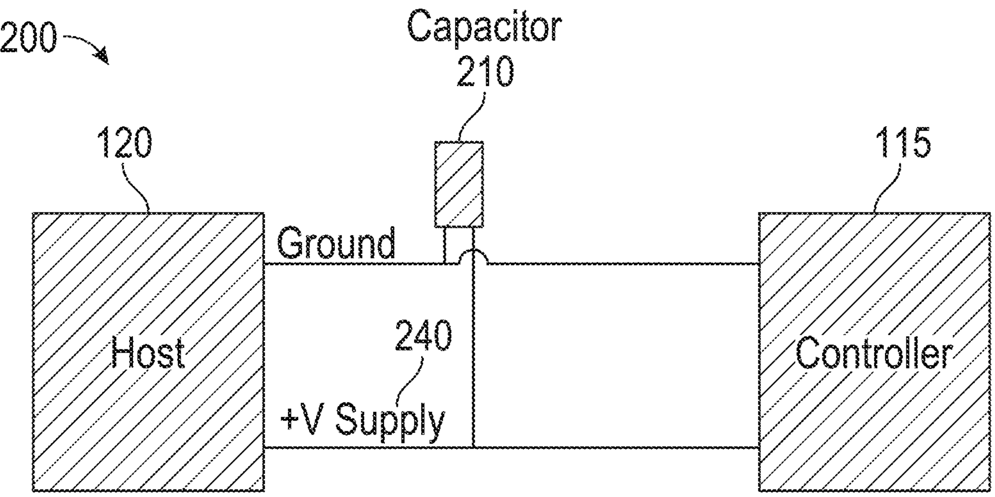
FIG. 2 is a block diagram of incomplete shutdown components coupled to the memory sub-system, in accordance with some examples.

FIG. 2 is a block diagram 200 of incomplete shutdown components coupled to the memory sub-system 110 of FIG. 1, in accordance with some examples. As shown in block diagram 200, the computing environment 100 can include the host system 120 coupled to the memory sub-system 110 (e.g., including the memory sub-system controller 115). The host system 120 can provide a power supply or power source 240 to the memory sub-system 110 and a ground source. Between the host system 120 and the memory sub-system controller 115, the computing environment 100 includes one or more capacitors 210.

The one or more capacitors 210 can be coupled to the power supply or power source 240, such as via one or more control switches (not shown). While the one or more capacitors 210 receive power from the power supply or power source 240 (e.g., prior to a power-loss event), a charge is built up and stored in the one or more capacitors 210. In some cases, when power from the power source 240 is cut off or removed (e.g., due to a power outage or asynchronous power-loss event), the one or more capacitors 210 stops being charged.

In some examples, power can stop being delivered to the one or more capacitors 210 and the memory sub-system controller 115 in response to a controlled power-loss event. This can be performed in response to the memory sub-system controller 115 receiving an instruction from the host system 120 to perform a power cycle operation or power OFF operation. In other cases, the power-loss event may occur due to an unexpected disruption in power that causes power being delivered to the computing environment 100 to be turned OFF (permanently or temporarily). Either of these scenarios can result in incomplete shutdown of the memory sub-system 110.

In circumstances where the power-loss event occurs as a result of a controlled power loss event, the host system 120 can set the Shutdown Notification (CC.SHN) field of the memory sub-system controller 115 to a certain value (e.g., 01b) to indicate a normal controller shutdown operation. In response to determining that the Shutdown Notification has been set to the certain value, the memory sub-system controller 115 begins or initiates performing one or more power-down operations. In some cases, the memory sub-system controller 115 (e.g., the firmware of the memory sub-system 110) finishes performing one or more power-down operations.

The memory sub-system controller 115 can be equipped to determine or detect a change from the power being delivered to the memory sub-system 110. Namely, the memory sub-system controller 115 can detect the power-loss event based on a momentary change in current and/or voltage resulting from power being shifted from being received from the power supply or power source 240 to being received from voltage being discharged by the one or more capacitors 210. In some cases, the memory sub-system controller 115 can be coupled to the one or more capacitors 210 via a different set of pins than the power supply or power source 240. When the memory sub-system controller 115 detects that power is being delivered from the pins associated with the one or more capacitors 210 instead of the pins associated with the power supply or power source 240, the memory sub-system controller 115 detects the power-loss event.

In response to detecting a power-loss event and in response to receiving power being discharged by the one or more capacitors 210, the memory sub-system controller 115 can begin performing shutdown operations. While these shutdown operations are being performed, the memory sub-system controller 115 can continuously or periodically store and/or flush debugging information from various registers or fields into the second portion 320 of the EEPROM 300.

FIG. 4 is a block diagram of example debugging field generation operations 400 performed based on a power-loss event, in accordance with some examples. Specifically, the block diagram of example debugging field generation operations 400 can be used to generate various debugging fields 410, such as the power loss flag field 412, panic mode status field 414, panic step field 416, double panic mode status field 417, and/or power supply error indicator field 418. Each of the various debugging fields 410 can be associated with a particular size 420 and value 430. The various debugging fields 410 can be set, flushed or cleared based on the set conditions 440, flush conditions 450, and/or clear conditions 460 specified in the operations 400.

For example, the power loss flag field 412 can be two bytes in size and can take on a value of 0xa55a. The power loss flag field 412 can be set when the asynchronous power loss operations begin being initiated and when no error has been detected as causing the power loss event. The power loss flag field 412 can be automatically stored or flushed to the second portion 320 of the EEPROM 300 when the asynchronous power loss operations are initiated or in response to determining that a panic mode has been initiated. The power loss flag field 412 can subsequently be automatically cleared when the host system 120 reads the second portion 320 of the EEPROM 300 in a bootup process, such as to perform debugging operations and/or in response to receiving a sanitize command from the host system 120 and/or the memory sub-system controller 115.

The panic mode status field 414 can be two bytes in size and can take on a value of the status code of the panic mode. The panic mode status field 414 can be set when the panic mode operations are initiated, such as in response to a power-loss event. The panic mode status field 414 can be automatically stored or flushed to the second portion 320 of the EEPROM 300 when the panic mode operations are initiated. The panic mode status field 414 can subsequently be automatically cleared in response to receiving a sanitize command from the host system 120 and/or the memory sub-system controller 115.

The panic step field 416 can be one byte in size and can take on a value of 1-10, representing different operations or steps being performed by the panic mode operations. The panic step field 416 can be set when the panic mode operations are initiated, such as in response to a power-loss event. For example, as cach panic mode operation completes, the panic step field 416 can be updated with a new value to represent the last panic mode operation that was completed. The panic step field 416 can be automatically stored or flushed periodically to the second portion 320 of the EEPROM 300 while the panic mode operations are performed. The panic step field 416 can subsequently be automatically cleared in response to receiving a sanitize command from the host system 120 and/or the memory sub-system controller 115.

The double panic mode status field 417 can be one byte in size and can take on a value of 0xA8. The double panic mode status field 417 can be set when the panic mode operations are initiated for a second time, such as during a power-loss event. The double panic mode status field 417 can be automatically stored or flushed to the second portion 320 of the EEPROM 300 when the panic mode operations are initiated for the second time. The double panic mode status field 417 can subsequently be automatically cleared in response to receiving a sanitize command from the host system 120 and/or the memory sub-system controller 115.

The power supply error indicator field 418 can be one byte in size and can take on a value of 0x4b for an error in the power supply or 0xb4 for an error in a communication with the power supply. The power supply error indicator field 418 can be set when the panic mode operations are initiated, such as during a power-loss event. The power supply error indicator field 418 can be automatically stored or flushed to the second portion 320 of the EEPROM 300 when the panic mode operations are initiated. The power supply error indicator field 418 can subsequently be automatically cleared in response to receiving a sanitize command from the host system 120 and/or the memory sub-system controller 115.

The various debugging fields 410 can be combined into a data structure and stored collectively in the second portion 320 of the EEPROM 300 to be read together by the host system 120 during debugging operations.

Figure 5:
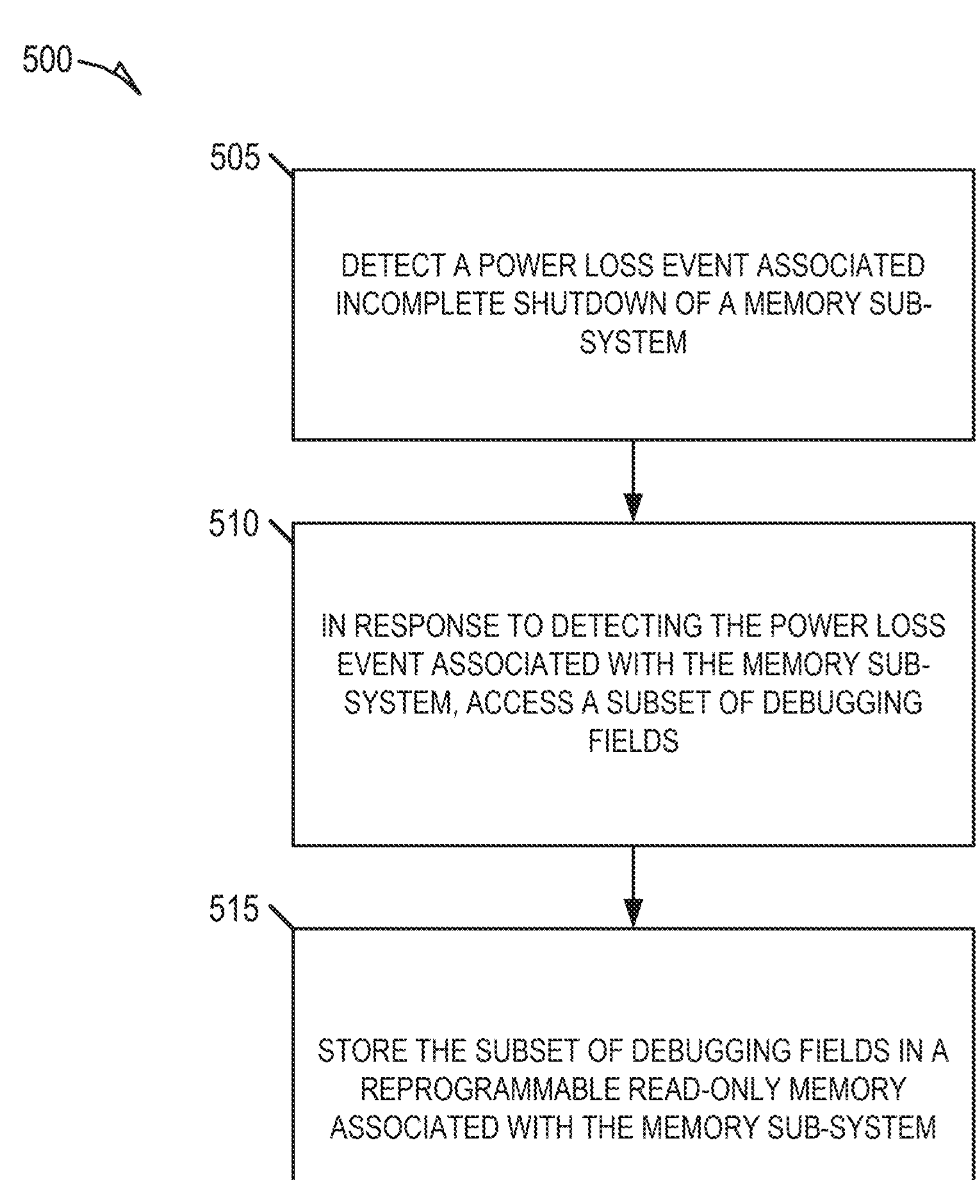
FIG. 5 is a flow diagram of an example method to debug incomplete shutdown of a memory sub-system, in accordance with some examples.

FIG. 5 is a flow diagram of an example method 500, in accordance with some examples. The method 500 can be performed by processing logic that can include hardware (e.g., a processing device, circuitry, dedicated logic, programmable logic, microcode, hardware of a device, an integrated circuit, etc.), software (e.g., instructions run or executed on a processing device), or a combination thereof. In some examples, the method 500 is performed by the media operations manager 122 of FIG. 1. Although the processes are shown in a particular sequence or order, unless otherwise specified, the order of the processes can be modified. Thus, the illustrated examples should be understood only as examples, and the illustrated processes can be performed in a different order, and some processes can be performed in parallel. Additionally, one or more processes can be omitted in various examples. Thus, not all processes are required in every example. Other process flows are possible.

Referring now to FIG. 5, the method (or process) 500 begins at operation 505, with a media operations manager 122 of a memory sub-system (e.g., memory sub-system 110) detecting a power-loss event associated incomplete shutdown of a memory sub-system 110. Then, at operation 510, the media operations manager 122, in response to detecting the power-loss event associated with the memory sub-system, retrieves a subset of debugging fields. The media operations manager 122 stores the subset of debugging fields in a reprogrammable read-only memory associated with the memory sub-system at operation 515.

In view of the disclosure above, various examples are set forth below. It should be noted that one or more features of an example, taken in isolation or combination, should be considered within the disclosure of this application.

Example 1: A system comprising: a set of memory components of a memory sub-system; and at least one processing device operatively coupled to the set of memory components, the at least one processing device configured to perform operations comprising: detecting a power-loss event associated with incomplete shutdown of the memory sub-system; in response to detecting the power-loss event associated with the memory sub-system, retrieving a subset of debugging fields; and storing the subset of debugging fields in a reprogrammable read-only memory associated with the memory sub-system.

Example 2. The system of Example 1, comprising: a capacitor coupled to the at least one processing device and configured to deliver power to the memory sub-system during a power-loss event.

Example 3. The system of Example 2, wherein the capacitor is coupled to a power source of the at least one processing device and a host system.

Example 4. The system of Example 3, wherein the at least one processing device is configured to receive power being discharged from the capacitor when power stops being received from the power source, the power-loss event occurring when the at least one processing device stops receiving power from the power source.

Example 5. The system of Example 4, wherein the at least one processing device is configured to retrieve the subset of debugging fields and store the subset of debugging fields before the capacitor completely discharges.

Example 6. The system of any one of Examples 1-6, wherein the reprogrammable read-only memory comprises an electrically erasable programmable read-only memory (EEPROM).

Example 7. The system of Example 6, wherein the EEPROM comprises a first portion for storing vendor product data (VPD) and a second portion reserved for storing the subset of debugging fields.

Example 8. The system of Example 7, wherein the VPD comprises a serial number, a manufacturer identifier, firmware version, capacity, interface type, flash type, write and read speeds, operating temperature range, power consumption, error correction code type, geometry information including number of planes and blocks, or a model number of the memory sub-system.

Example 9. The system of any one of Examples 1-8, wherein the subset of debugging fields comprises a power-loss flag field, the power-loss flag field being set in response to initiating power loss functions associated with the power-loss event.

Example 10. The system of Example 9, the operations comprising: storing the power-loss flag field in the reprogrammable read-only memory in response to initiating the power-loss functions or in response to detecting initiation of a panic mode.

Example 11. The system of any one of Examples 9-10, wherein the power-loss flag field is cleared in response to being read from the reprogrammable read-only memory when no error is detected or in response to a sanitize command.

Example 12. The system of any one of Examples 1-11, wherein the subset of debugging fields comprises a panic mode status field, the panic mode status field being set and stored in the reprogrammable read-only memory in response to initiating panic mode.

Example 13. The system of Example 12, wherein the panic mode status field is cleared in response to a sanitize command.

Example 14. The system of any one of Examples 12-13, wherein the subset of debugging fields comprises a panic step field, the panic step field being set during the panic mode and representing individual operations of the panic mode.

Example 15. The system of Example 14, the operations comprising storing the panic step field periodically during the panic mode in the reprogrammable read-only memory.

Example 16. The system of any one of Examples 1-15, wherein the subset of debugging fields comprises a double panic mode status field, the double panic mode status field being set and stored in the reprogrammable read-only memory in response to initiating panic mode a second time.

Example 17. The system of any one of Examples 1-16, wherein the subset of debugging fields comprises a power supply error indicator field, the power supply error indicator field being set and stored in the reprogrammable read-only memory in response to initiating panic mode, the power supply error indicator field indicating whether an error has been encountered in association with a power supply of the memory sub-system.

Example 18. The system of any one of Examples 1-17, the operations comprising reading the subset of debugging fields from the reprogrammable read-only memory associated with the memory sub-system to debug a reason for the incomplete shutdown of the memory sub-system.

Example 19. A method comprising: detecting a power-loss event associated with incomplete shutdown of a memory sub-system; in response to detecting the power-loss event associated with the memory sub-system, retrieving a subset of debugging fields; and storing the subset of debugging fields in a reprogrammable read-only memory associated with the memory sub-system.

Example 20. A non-transitory computer-readable storage medium comprising instructions that, when executed by at least one processing device, cause the at least one processing device to perform operations comprising: detecting a power-loss event associated with incomplete shutdown of a memory sub-system; in response to detecting the power-loss event associated with the memory sub-system, retrieving a subset of debugging fields; and storing the subset of debugging fields in a reprogrammable read-only memory associated with the memory sub-system.

Methods and non-transitory computer-readable storage medium for performing any of the above Examples.

Figure 6:
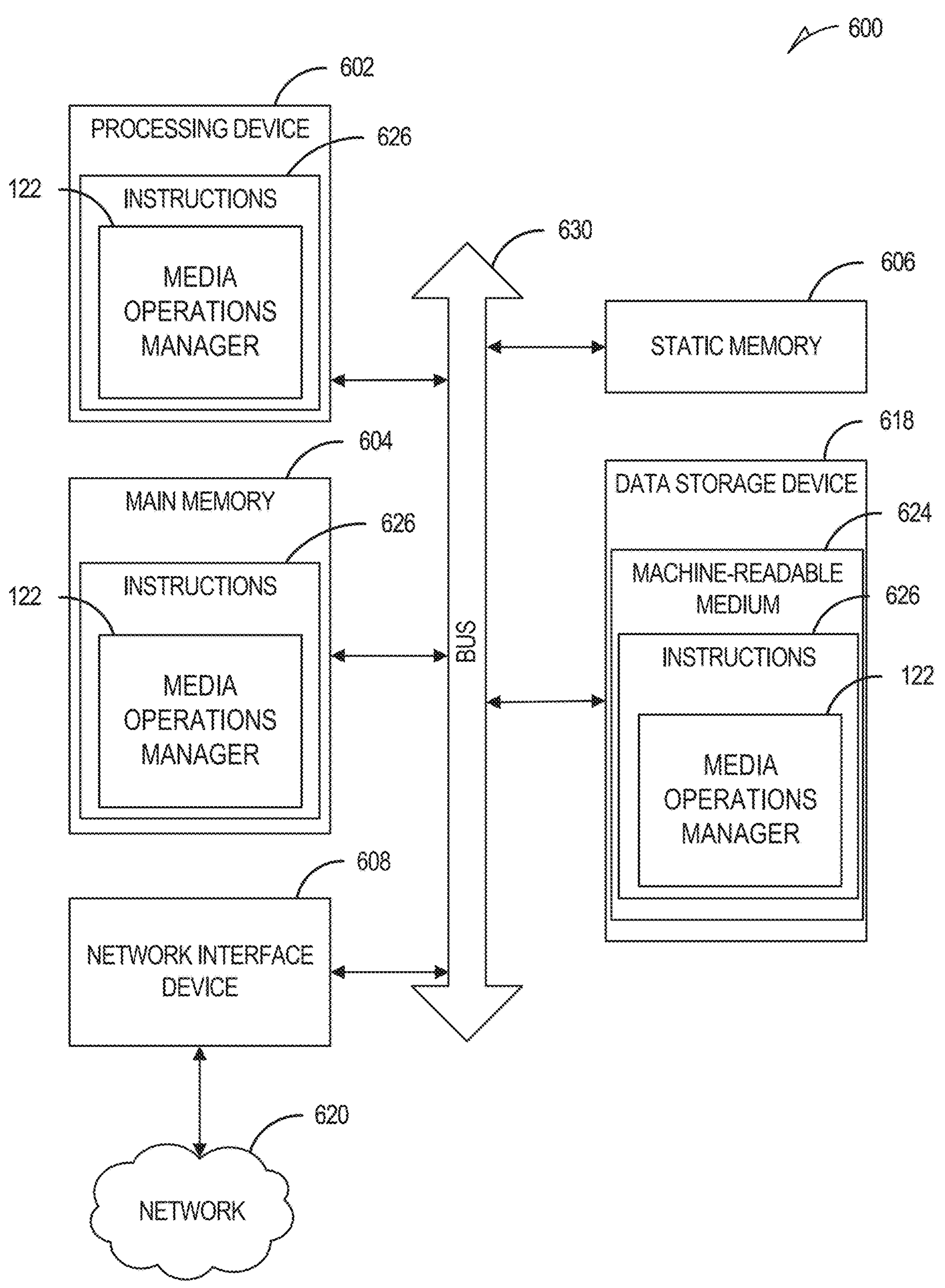
FIG. 6 is a block diagram illustrating a diagrammatic representation of a machine in the form of a computer system within which a set of instructions can be executed for causing the machine to perform any one or more of the methodologies discussed herein, in accordance with some examples of the present disclosure.

FIG. 6 illustrates an example machine in the form of a computer system 600 within which a set of instructions 626 can be executed for causing the machine to perform any one or more of the methodologies discussed herein. In some examples, the computer system 600 can correspond to a host system (e.g., the host system 120 of FIG. 1) that includes, is coupled to, or utilizes a memory sub-system (e.g., the memory sub-system 110 of FIG. 1) or can be used to perform the operations of a controller (e.g., to execute an operating system to perform operations corresponding to the media operations manager 122 of FIG. 1). In alternative examples, the machine can be connected (e.g., networked) to other machines in a local area network (LAN), an intranet, an extranet, and/or the Internet. The machine can operate in the capacity of a server or a client machine in a client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a network switch, a network bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 600 includes a processing device 602, a main memory 604 (e.g., ROM, flash memory, DRAM such as SDRAM or Rambus DRAM (RDRAM), etc.), a static memory 606 (e.g., flash memory, static random access memory (SRAM), etc.), and a data storage device 618, which communicate with each other via a bus 630.

The processing device 602 represents one or more general-purpose processing devices such as a microprocessor, a central processing unit, or the like. More particularly, the processing device 602 can be a complex instruction set computing (CISC) microprocessor, a reduced instruction set computing (RISC) microprocessor, a very long instruction word (VLIW) microprocessor, a processor implementing other instruction sets, or processors implementing a combination of instruction sets. The processing device 602 can also be one or more special-purpose processing devices such as an ASIC, a FPGA, a digital signal processor (DSP), a network processor, or the like. The processing device 602 is configured to execute instructions 626 for performing the operations and steps discussed herein. The computer system 600 can further include a network interface device 608 to communicate over a network 620.

The data storage system 618 can include a machine-readable storage medium 624 (also known as a computer-readable medium) on which is stored one or more sets of instructions 626 or software embodying any one or more of the methodologies or functions described herein. The instructions 626 can also reside, completely or at least partially, within the main memory 604 and/or within the processing device 602 during execution thereof by the computer system 600, the main memory 604 and the processing device 602 also constituting machine-readable storage media. The machine-readable storage medium 624, data storage system 618, and/or main memory 604 can correspond to the memory sub-system 110 of FIG. 1.

In one example, the instructions 626 implement functionality corresponding to the media operations manager 122 of FIG. 1. While the machine-readable storage medium 624 is shown in an example to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system's memories or registers or other such information storage systems.

The present disclosure also relates to an apparatus for performing the operations herein. This apparatus can be specially constructed for the intended purposes, or it can include a general-purpose computer selectively activated or reconfigured by a computer program stored in the computer. Such a computer program can be stored in a computer-readable storage medium, such as, but not limited to, any type of disk including floppy disks, optical disks, CD-ROMs, and magnetic-optical disks; ROMs; random access memories (RAMs); EPROMS; EEPROMs; magnetic or optical cards; or any type of media suitable for storing electronic instructions, each coupled to a computer system bus.

The algorithms and displays presented herein are not inherently related to any particular computer or other apparatus. Various general-purpose systems can be used with programs in accordance with the teachings herein, or it can prove convenient to construct a more specialized apparatus to perform the method. The structure for a variety of these systems will appear as set forth in the description above. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some examples, a machine-readable (e.g., computer-readable) medium includes a machine-readable (e.g., computer-readable) storage medium such as a ROM, RAM, magnetic disk storage media, optical storage media, flash memory components, and so forth.

In the foregoing specification, the disclosure has been described with reference to specific examples thereof. It will be evident that various modifications can be made thereto without departing from the broader scope of the disclosure as set forth in the following claims. The specification and drawings are, accordingly, to be regarded in an illustrative sense rather than a restrictive sense.

What is claimed is:

1. A system comprising:

a set of memory components of a memory sub-system; and at least one processing device operatively coupled to the set of memory components, the at least one processing device programmed to perform operations comprising:

detecting a power-loss event associated with an incomplete shutdown of the memory sub-system, the incomplete shutdown comprising one or more shutdown operations not being initiated or not being completed before power to the memory sub-system is lost;

based on detecting the power-loss event associated with the incomplete shutdown of the memory sub-system, retrieving a subset of debugging fields; and storing the subset of debugging fields in a reprogrammable read-only memory associated with the memory sub-system, wherein the subset of debugging fields comprises a panic step field that is set during a panic mode and represents one or more individual operations of the panic mode.

2. The system of claim 1, comprising:

a capacitor coupled to the at least one processing device and configured to deliver power to the memory sub-system during a power-loss event.

3. The system of claim 2, wherein the capacitor is coupled to a power source of the at least one processing device and a host system.

4. The system of claim 3, wherein the at least one processing device is configured to receive power being discharged from the capacitor when power stops being received from the power source, the power-loss event occurring when the at least one processing device stops receiving power from the power source.

5. The system of claim 4, wherein the at least one processing device is configured to retrieve the subset of debugging fields and store the subset of debugging fields before the capacitor completely discharges.

6. The system of claim 1, the operations comprising storing the panic step field periodically.

7. The system of claim 1, wherein the reprogrammable read-only memory comprises a first portion for storing vendor product data (VPD) and a second portion reserved for storing the subset of debugging fields, the incomplete shutdown resulting in data corruption and data loss.

8. The system of claim 7, wherein the VPD comprises a serial number, a manufacturer identifier, firmware version, capacity, interface type, flash type, write and read speeds, operating temperature range, power consumption, error correction code type, geometry information including number of planes and blocks, or a model number of the memory sub-system.

9. The system of claim 1, wherein the subset of debugging fields comprises a power-loss flag field, the power-loss flag field being set in response to initiating power-loss functions associated with the power-loss event.

10. The system of claim 9, the operations comprising:

storing the power-loss flag field in the reprogrammable read-only memory in response to initiating the power-loss functions or in response to detecting initiation of a panic mode.

11. The system of claim 9, wherein the power-loss flag field is cleared in response to being read from the reprogrammable read-only memory when no error is detected or in response to a sanitize command.

12. The system of claim 1, wherein the subset of debugging fields comprises a panic mode status field, the panic mode status field being set and stored in the reprogrammable read-only memory in response to initiating panic mode.

13. The system of claim 12, wherein the panic mode status field is cleared in response to a sanitize command.

14. The system of claim 1, the operations comprising storing the panic step field periodically during the panic mode in the reprogrammable read-only memory.

15. The system of claim 1, wherein the subset of debugging fields comprises a double panic mode status field, the double panic mode status field being set and stored in the reprogrammable read-only memory in response to initiating panic mode a second time.

16. The system of claim 1, wherein the subset of debugging fields comprises a power supply error indicator field, the power supply error indicator field being set and stored in the reprogrammable read-only memory in response to initiating panic mode, the power supply error indicator field indicating whether an error has been encountered in association with a power supply of the memory sub-system.

17. The system of claim 1, the operations comprising reading the subset of debugging fields from the reprogrammable read-only memory associated with the memory sub-system to debug a reason for the incomplete shutdown of the memory sub-system.

18. A method comprising:

detecting a power-loss event associated with an incomplete shutdown of a memory sub-system, the incomplete shutdown comprising one or more shutdown operations not being initiated or not being completed before power to the memory sub-system is lost;

based on detecting the power-loss event associated with the incomplete shutdown of the memory sub-system, retrieving a subset of debugging fields; and storing the subset of debugging fields in a reprogrammable read-only memory associated with the memory sub-system, wherein the subset of debugging fields comprises a panic step field that is set during a panic mode and represents one or more individual operations of the panic mode.

19. The method of claim 18, comprising storing the panic step field periodically during the panic mode in the reprogrammable read-only memory.

20. A non-transitory computer-readable storage medium comprising instructions that, when executed by at least one processing device, cause the at least one processing device to perform operations comprising:

detecting a power-loss event associated with an incomplete shutdown of a memory sub-system, the incomplete shutdown comprising one or more shutdown operations not being initiated or not being completed before power to the memory sub-system is lost;

based on detecting the power-loss event associated with the incomplete shutdown of the memory sub-system, retrieving a subset of debugging fields; and storing the subset of debugging fields in a reprogrammable read-only memory associated with the memory sub-system, wherein the subset of debugging fields comprises a panic step field that is set during a panic mode and represents one or more individual operations of the panic mode.

* * * * *